(12) United States Patent
Limmer

(10) Patent No.: US 6,831,422 B2
(45) Date of Patent: Dec. 14, 2004

(54) OPERATING CIRCUIT WITH AN IMPROVED POWER SUPPLY FOR A DRIVER CIRCUIT

(75) Inventor: Walter Limmer, Munich (DE)

(73) Assignee: Patent Treuhand Gesellschaft fur elektrische Gluhlampen mbH, Munich (DE)

( * ) Notice: Subject to any disclaimer, the term of this patent is extended or adjusted under 35 U.S.C. 154(b) by 0 days.

(21) Appl. No.: 10/651,969

(22) Filed: Sep. 2, 2003

(65) Prior Publication Data
US 2004/0041621 A1 Mar. 4, 2004

(30) Foreign Application Priority Data
Sep. 4, 2002 (DE) .......................................... 102 41 304

(51) Int. Cl.⁷ .............................................. H05B 37/02
(52) U.S. Cl. .............. 315/209 R; 315/224; 315/DIG. 7
(58) Field of Search ............................ 315/209 R, 224, 315/291, 307, DIG. 7; 363/132, 98; 320/166

(56) References Cited

U.S. PATENT DOCUMENTS

| | | | | |
|---|---|---|---|---|
| 5,550,436 A | * | 8/1996 | Houk ...................... | 315/209 R |
| 5,729,096 A | * | 3/1998 | Liu et al. ..................... | 315/307 |
| 5,828,184 A | * | 10/1998 | Nadd ..................... | 315/209 R |
| 6,710,474 B2 | * | 3/2004 | Franck ................... | 315/209 R |

FOREIGN PATENT DOCUMENTS

GB          2307605        * 5/1997

* cited by examiner

Primary Examiner—Tuyet Vo
Assistant Examiner—Ephrem Alemu

(57) ABSTRACT

The invention relates to the supply of power to a driver circuit (V) for a switching transistor (T) in an operating circuit, in particular for lamps. The supply is provided via a pump circuit with a potential isolation capacitor ($C_2$), two rectifier diodes ($D_1$, $D_2$) and an energy-storage capacitor ($C_1$), and is independent of the reference ground potential of the switching transistor (T).

13 Claims, 3 Drawing Sheets

OPERATING CIRCUIT WITH AN IMPROVED POWER SUPPLY FOR A DRIVER CIRCUIT

TECHNICAL FIELD

The invention relates to an operating circuit for a load, which contains a switching transistor that is driven by a driver circuit.

The invention thus relates in particular, but not exclusively, to an operating circuit for lamps.

BACKGROUND ART

Operating circuits generally contain at least one switching transistor which, for example in the case of an inverter, connects a load-side connection to a supply potential on a pulsed basis. The switching transistor must be driven accordingly, that is to say it must be supplied with suitable potentials at its control connection, taking into account its function. This also applies in a general form to what are referred to as current-controlled switching transistors, such as bipolar transistors.

The switching transistor is driven by a circuit part which is in general referred to as a driver circuit. This expression, without being restrictive, is used in the following text for any type of driver for the switching transistor.

The driver circuit itself in turn requires appropriate supply potentials. An energy-storage capacitor for storing electrical energy for operation of the driver circuit is frequently used here. This energy-storage capacitor must therefore be supplied with suitable potentials.

Depending on the circumstances of the circuitry for the switching transistor, problems may occur in this case with the provision of the supply potentials for the driver circuit and/or for its energy-storage capacitor. This is particularly true in the case of what are referred to as high switching transistors, one of whose connections is connected to the supply potential of the operating circuit, and whose other connection is connected on the load side (this is what is referred to as a high-side driver circuit). The expression "load side" in this case also means an indirect connection to the load, for example via intermediate inductors, diodes and the like.

DISCLOSURE OF THE INVENTION

The invention is based on the technical problem of specifying an operating circuit for operation of a load having a high switching transistor, in which a driver circuit with an improved supply is used.

For this purpose, the invention is based on a circuit for operation of a load having a switching transistor which is connected on one side (in the above sense) to a supply potential and whose other side is the load side, and whose control connection can at least at times be driven outside the potential range between the supply potential and the potential on the load-side connection of the switching transistor, which circuit also has a driver circuit for driving the control connection, and an energy-storage capacitor for supplying the driver circuit with a supply power; characterized by a pump circuit for charging the energy-storage capacitor from an alternating supply potential which is independent of the potential at the load-side connection, with a series circuit, which connects the connections of the energy storage capacitor, of two rectifier diodes connected in the same direction and with a potential isolation capacitor which is connected to a tap between the rectifier diodes on one side and the alternating supply potential on the other side.

The basic idea of the invention is thus to supply the energy-storage capacitor with an alternating supply potential whose potential can be kept completely independent of the load-side connection of the switching transistor. A potential isolation capacitor is used in the pump circuit, for this purpose. Via this potential isolation capacitor, the alternating supply potential is coupled to a center tap between two series-connected rectifier diodes which are connected in the same direction, thus charging in the same sense an energy-storage capacitor which is connected between those connections of the rectifier diodes which are opposite the center tap. In this case, the potential on the energy-storage capacitor can be related to a reference ground potential which is advantageous for the driver circuit, that is to say in particular also to a potential which fluctuates during operation of the operating circuit. Thus, for example, if an FET (field-effect transistor) is used as a high switching transistor, and its source connection is connected on the load side, then the driver circuit can be operated by the pump circuit with an alternating supply potential whose potential is independent of the source potential on the switching transistor.

Since, for example in the case of inverters, the load-side connection of the switching transistor fluctuates between an (internal) ground potential and the supply potential of the inverter, it is thus possible to supply the driver circuit with a normal supply potential via the pump circuit, even in switching states in which the load-side connection is essentially at the supply potential. This supply potential for the driver circuit may, for example, be the potential which is used for other driver circuits or logic circuits in the operating circuit and in the vicinity of its circuit and, specifically, its magnitude may be considerably less (that is to say closer to ground) than the supply potential for the inverter. The pump circuit thus offers a capability, which is particularly simple in terms of potential and, also in terms of time, can be operated independently of the respective operating phase of the operating circuit, for supplying the energy-storage capacitor.

This avoids, in particular, the necessity (as is known from the prior art) to use quite specific operating phases with advantageous potential relationships for charging the energy-storage capacitor. Reference will be made to the exemplary embodiment, in order to explain this in more detail. Nevertheless, of course, the invention can be used, possibly for other reasons, in a specific manner for operation of the operating circuit, at appropriate times.

One preferred application of the invention is for switching transistors with an FET input, that is to say an actual FET, in particular a MOSFET, or for what are referred to as IGBTs (Insulated Gate Bipolar Transistors). In contrast to pure bipolar transistors, these require relatively high voltages to switch them on, in comparison to the reference ground potential of the transistor.

A protection resistor, which is referred to here as a first resistor, may be provided between the potential isolation capacitor and its alternating supply voltage.

This may be used in particular to protect the output which provides the alternating supply voltage, for example a MOSFET gate, against relatively high currents, which may occur when the reference ground potential of the switching transistor, that is to say in particular the load-side connection, changes its potential quickly, and this sudden potential change across the potential isolation capacitor makes itself evident as a current surge of the output. The protection resistor damps such current surges by virtue of the RC constant that is formed together with the potential isolation capacitor.

Furthermore, potential clamping is preferably provided between said alternating supply voltage and the potential isolation capacitor, in order to make it possible to provide impedance decoupling. This may be done on the one hand by using two series-connected rectifier diodes which are connected in the same direction, and whose center tap is located between the alternating supply potential and the potential isolation capacitor, with a resistor which is referred to here as a second resistor being provided between the center tap and the alternating supply potential. In this case, apart from this, a further protection resistor may also be provided between the center tap and the potential isolation capacitor. On the other hand, a circuit with a zener diode may be used, which clamps a line point between a resistor on the alternating supply potential side (referred to as the second resistor) and the potential isolation capacitor. In this case as well, further protection resistors may be provided between the clamped point and the potential isolation capacitor.

The alternating supply potential may be obtained in widely differing manners. In many cases, an alternating supply potential such as this is already available in any case and can be produced with only a small amount of complexity by means of an unused gate. For example, it is also possible to use drive potentials for other switching transistors, for example in a step-up converter.

If the alternating supply potential for the pump circuit is relatively high, it may be worthwhile protecting the energy-storage capacitor by means of a voltage-limiting element. This may in particular be a zener diode which is connected in parallel with the energy-storage capacitor, and hence in parallel with the series circuit formed by the rectifier diodes. However, the alternating supply potential should not be so high that disturbingly high power losses are produced in such a zener diode. Reference should be made to the exemplary embodiment for illustration.

In general, the invention is also based on operating circuits for any desired loads, but in particular on lamp operating circuits, that is to say electronic ballasts for lamps. Different lamp types are relevant in this case. On the one hand, these may be electronic ballasts for example for halogen incandescent lamps. However, ballasts for gas discharge lamps are particularly preferred. This on the one hand refers to inverters for low-pressure gas discharge lamps.

On the other hand, however, the invention is aimed in particular at ballasts for high-pressure discharge lamps. In the case of ballasts such as these, what are referred to as high switching transistors are used, for example, in full bridge circuits, which contain the high-pressure discharge lamp and apply a largely constant supply potential for the lamp to the lamp, pulsed with a different polarity. Problems which occur as a result of unidirectional operation, such as color shifts, nonuniform electrode wear and the like should thus be avoided. Secondly, in the case of ballasts for high-pressure discharge lamps, step-down converters or other oscillators are frequently used to produce an alternating voltage supply which is required for a lamp inductor, and these likewise contain high transistors.

These two applications can also occur combined with one another in ballasts for high-pressure discharge lamps.

BRIEF DESCRIPTION OF THE DRAWINGS

The invention will be explained in more detail in the following text using a specific illustration of one example for the prior art and using two exemplary embodiments with different variants. Individual features which are disclosed in the process may also be significant to the invention in other combinations.

BEST MODE FOR CARRYING OUT THE INVENTION

Figure 1:
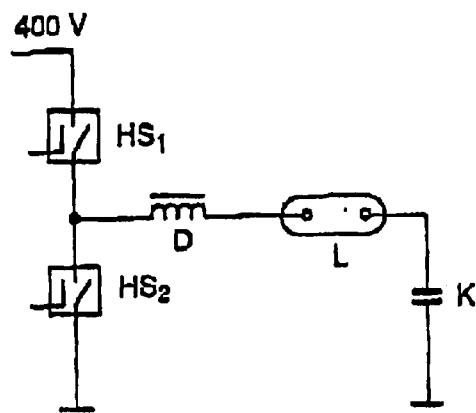
FIG. 1 shows a schematic illustration of an intrinsically conventional inverter circuit with a half bridge.

FIG. 1 shows a first example of an operating circuit for a lamp L, to be precise a half bridge circuit with two switching transistors $HS_1$ and $HS_2$. However, in conjunction with a driver circuit (which is still to be explained) for the switching transistor $HS_1$, a circuit as shown in FIG. 1 forms an exemplary embodiment of the invention. In this circuit, the switching transistor $HS_1$ is, for the purposes of the invention, "high", that is to say it is connected between a supply potential of, for example, 400 V and a center tap of the half bridge. The center tap is connected via a conventional lamp inductor D to the load, namely a discharge lamp L. The load is in turn connected to the ground point within the device, via a capacitor K. The discharge lamp L may, in particular, be a low-pressure discharge lamp in which electronic ballasts constructed on this principle are normally used. The functions of the lamp inductor D for the capacitor K are generally known and need not be explained here in detail. Overall, the circuit is highly simplified and is used only to illustrate the positions of the switching transistor $HS_1$ which is essential to the invention. This is because, in contrast, the second switching transistor $HS_2$ is "low" for the purpose of the invention, in this case connecting the ground point within the device to the load-side center tap.

During operation, the potential at this center tap is switched backward and forward between the supply potential of 400 V, in this case, and ground by alternating switching operation of the switching transistors $HS_1$ and $HS_2$, thus resulting in the supply power for the discharge lamp L at the appropriate operating frequency of, typically, 25 to 50 kHz.

The essential feature is that the switching transistor $HS_1$ requires a voltage in the order of magnitude of, for example, about 10 V with respect to the load-side source electrode at its control connection, that is to say in particular at the gate electrode of the MOSFET transistors that are preferred here, in order to switch on reliably. This is the task of a driver circuit, a conventional embodiment of which is shown in more detail in FIG. 3. Switching transistors that are driven by appropriate driver circuits in operating circuits are referred to as externally controlled switching transistors. These devices are accordingly externally controlled inverters and oscillators.

Figure 3:
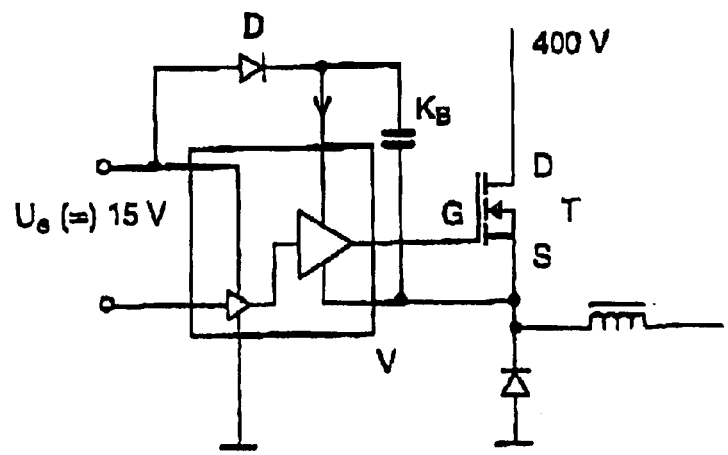
FIG. 3 shows a schematic illustration of a conventional driver circuit for a switching transistor as shown in FIG. 2.

First of all, in FIG. 3, the diode shown at the bottom right must be regarded as being replaced by the lower switching transistor $HS_2$ from FIG. 1; the switching transistor T that is shown thus corresponds to the transistor $HS_1$ from FIG. 1. The drive voltage which has been mentioned must be produced between its gate connection G and its source connection. This is done by using a driver circuit, which is annotated V and contains an amplifier that is shown in the box V on the right. The supply for this amplifier is related to the potential at the source connection of the switching transistor T, and is provided by an energy-storage capacitor $K_B$. The energy-storage capacitor $K_B$ which is illustrated in FIG. 3 is occasionally referred to as a bootstrap capacitor. This energy-storage capacitor must be charged to the appropriate voltage. This is done by using a DC supply voltage $U_e$ of about 15 V, which is provided in the operating circuit in any case, in order to supply various logic circuits. However, this is related to the ground point within the device. An adequate voltage is thus available only when the lower switching transistor $HS_2$ is closed, and the source connection of the upper switching transistor $HS_1$ is thus essentially at the ground potential within the device. At this time, the energy-storage capacitor $K_B$ is charged from the DC supply voltage $U_e$ via the diode D. When the potential at the source connection of the switching transistor $HS_1$ or T essentially rises to the supply potential of 400 V after the opening of the lower switching transistor $HS_2$ and the closing of the upper switching transistor $HS_1$ or T, the potential isolation on the diode D, which is now reverse-biased, shifts the voltage at that connection of the energy-storage capacitor $K_B$ which is at the top in FIG. 3, so that the supply voltage which is required for the driver circuit V is available as before, despite the shift in the potential at the source connection. However, for the reasons which have been mentioned, the charging phases are limited to the times when there is a suitable low potential at the center tap. Depending on the desired clock frequency for the switching operation of the switching transistors, the energy-storage capacitor $K_B$ must therefore be able to store the energy that is required for the driver circuit for a sufficiently long time.

Figure 2:
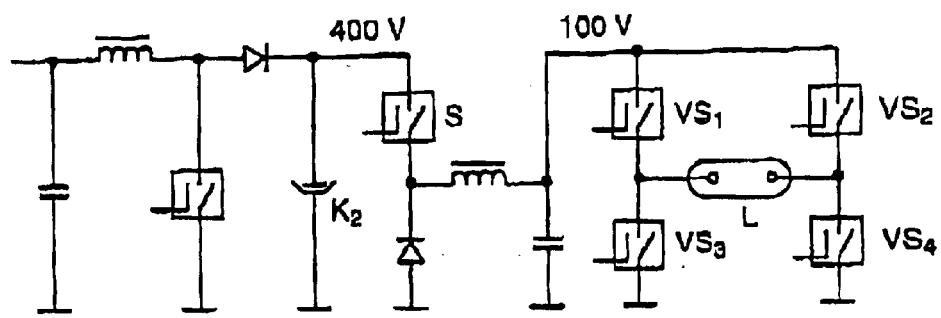
FIG. 2 shows a schematic illustration of an intrinsically conventional operating circuit with a step-down converter and a full bridge.

A further conventional switching diagram is shown in FIG. 2. This relates to the schematic operating circuit of a high-pressure discharge lamp L, which is connected in the full bridge, which is shown on the right in FIG. 2 and is formed by the switching transistors $VS_1$ to $VS_4$. In this case, the switching transistors $VS_1$ and $VS_4$ on the one hand and $VS_2$ and $VS_3$ on the other hand are connected together, so that the voltage of about 100 V which is produced on the path at the top can be applied with alternating polarity to the high-pressure discharge lamp L. For the reasons which have already been mentioned, this is worthwhile for high-pressure lamps. The switching transistors $VS_1$ and $VS_3$ on the one hand and $VS_2$ and $VS_4$ on the other hand in principle form a half bridge as shown in FIG. 1.

The supply potential of about 100 V for the full bridge is provided by a capacitor which is not annotated in FIG. 2. This capacitor is charged via a lamp inductor, which is likewise not annotated but which carries out similar functions to the lamp inductor D in FIG. 1. The lamp inductor is connected to the center tap of a step-down converter by the upper switching transistor S and the lower diode, which is also shown in FIG. 3. This diode is used instead of the switching transistor $HS_2$ from FIG. 1, and provides a current when the switching transistor S is open. The switching concept of the step-down converter is known per se and will not be explained in detail here. It uses a supply potential of about 400 V, which corresponds to the corresponding supply potential in FIG. 1, in a similar way to the half bridge shown in FIG. 1 to produce an alternating supply voltage for the full bridge and for the high-pressure discharge lamp L. This alternating supply voltage at the step-down converter frequency is required for operation of the lamp inductor which, in this case as well, is used for characteristic stabilization owing to the negative differential resistance of discharge lamps. The AC voltage which is provided by the step-down converter is, however, smoothed further by the already mentioned capacitor, so that what is applied to the full bridge is essentially a DC voltage. Owing to the risk of internal resonances, the operating frequency of the supply for the high-pressure discharge lamp L from the full bridge is generally not significantly greater than 1 kHz, that is to say it is considerably less than a normal operating frequency for the half bridge shown in FIG. 1.

The step-down converter in FIG. 2 with the switching transistor S is in turn supplied with an essentially constant DC voltage of about 400 V from a step-up converter, which comprises the components shown to the left of the switching transistor S in FIG. 2, namely the inductor, the diode, the further switching transistor and the electrolytic capacitor $K_2$. The step-up converter is a power factor correction circuit and is essentially used for producing a largely constant DC voltage from a rectified mains AC voltage when a largely sinusoidal current is at the same time being drawn from the mains system. A rectifier and filter circuit, which is not shown in any more detail, is connected upstream of this. This circuit, including the step-up converter, will in practice also be present in the illustrated form or in a similar form on the left in the half bridge that is shown in FIG. 1. It is, however, of no further importance for the invention.

The operating circuit shown in FIG. 2 has, on the one hand, a further high switching transistor with the transistor S in a position which is comparable to that of the switching transistor $HS_1$ as shown in FIG. 1. However, furthermore, the switching transistors $VS_1$ and $VS_2$ from the full bridge are also high in the sense of the invention, but with respect to a different supply potential. The driver circuit illustrated in FIG. 3 can be produced in each case using these three switching transistors S, $VS_1$, $VS_2$. The statements which have been made above with reference to the transistor $HS_1$ also apply in the same sense to these three switching transistors.

Figure 4:
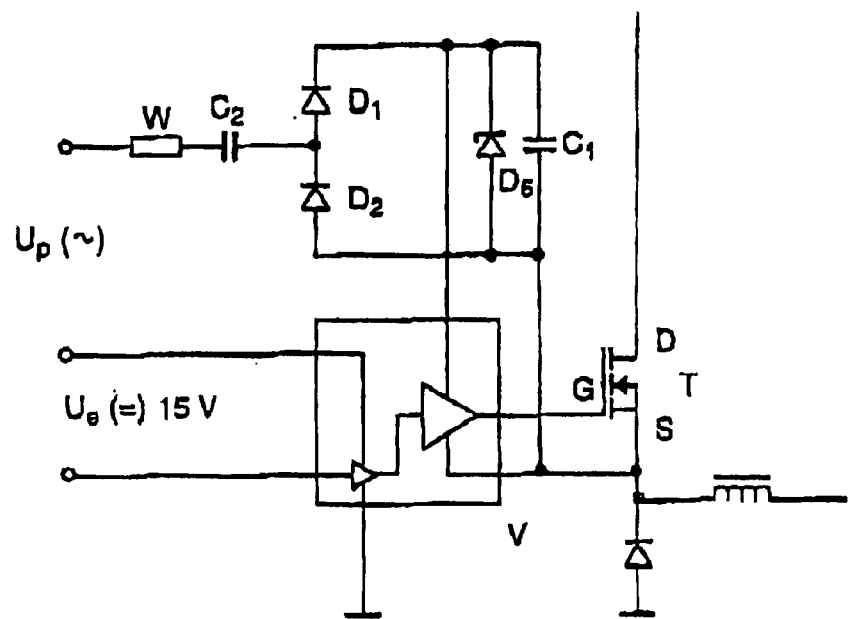
FIG. 4 shows a driver circuit according to the invention for the switching transistor as shown in FIGS. 2 and 3.

FIG. 4 shows the solution according to the invention for supplying the driver circuit. This is based on the same switching transistor $T_1$, the same actual driver circuit V (without a supply) and the same supply potential $U_e$ as in FIG. 3. However, the equivalent item to the energy-storage capacitor $K_B$ is an energy-storage capacitor $C_1$, which is annotated differently because it may be designed to be considerably smaller than the energy-storage capacitor $K_B$. This capacitor is charged via a series circuit, which connects its two connections, formed by two rectifier diodes $D_1$ and $D_2$, to whose center tap a potential isolation capacitor $C_2$ is connected. The potential isolation capacitor $C_2$ is clamped by the two diodes $D_1$ and $D_2$ at a respective forward voltage of, for example, 0.7 V, so that voltage pulses of less than this positive and negative forward voltage are in each case discharged via the diodes to the energy-storage capacitor $C_1$. Its other connection is connected to an alternating supply potential $U_p$ via a protection resistor W. The protection resistor W corresponds to what is referred to as the first non-reactive resistor. Overall, this results in a pump circuit for charging the energy-storage capacitor $C_1$ independently of the potential at the source connection, which is connected to the lower connection of the energy-storage capacitor $C_1$. The pump circuit couples the AC voltage via the potential isolation capacitor $C_2$ to the energy-storage capacitor $C_1$. The two diodes $D_1$ and $D_2$ in this case ensure that charging always takes place on a unipolar basis, independently of the respective mathematical signs of the AC voltage pulses that are injected. Since the potential isolation capacitor $C_2$ produces pure AC voltage coupling, while at the same time providing DC isolation, the energy-storage capacitor $C_1$ has no conductive coupling to the alternating supply potential $U_p$. It can thus be charged continuously and completely independently of the potential state at the source connection S, and thus of its own potential. There is therefore no longer any need for a restriction to advantageous switching phases of the operating circuit. Thus, however, the energy-storage capacitor can also be designed for considerably smaller charges and storage times, and can thus be designed to be smaller and cheaper.

A voltage-limiting zener diode $D_6$ with a breakdown voltage of, for example, 15 V may be provided in order to protect the driver circuit V. It is thus possible to use, for example, the drain potential of the step-up transistor from FIG. 2 or any other potential which is intrinsically too high, and which need not be produced specifically, as the alternating supply potential $V_p$.

Furthermore, this provides the freedom to switch the switching transistor T at any desired speed without endangering the driver circuit V.

One particular problem occurs in the case of high-pressure discharge lamps in which the full bridge illustrated in FIG. 2 also operates at relatively low frequencies in certain operating states of the high-pressure discharge lamp L.

In operating states such as these, the bootstrap capacitor $K_B$ from FIG. 3 has to store the energy that is required by the driver circuit V over one complete period length which, for example in the case of starting processes for high-pressure discharge lamps and during what are referred to as direct-current phases during the starting of a high-pressure discharge lamp, may correspond to times in the order of magnitude of seconds. The bootstrap capacitor $K_B$ therefore has to have a quite significant capacitance, in the order of magnitude of several tens of microfarads, for example. Taking into account the further requirements relating to the operating temperature, the life and the withstand voltage, this can lead to considerable component costs. Furthermore, the diode D must have a withstand voltage which is adequate for the supply potential of about 400 V in this example.

In contrast, a relatively small energy-storage capacitor $C_1$ can be used in the circuit shown in FIG. 4 since, essentially, this can be charged continuously. This solution is considerably better, even taking into account the additional costs for the potential isolation capacitor $C_2$.

What is referred to as the first non-reactive resistor W in FIG. 4 protects a MOSFET gate, which is normally used to provide the alternating supply potential $U_p$, or any other output stage against excessively large current surges, which can be injected via the potential isolation capacitor $C_2$ as a result of sudden potential changes at the source connection of the switching transistor T. In order to ensure that the switching of the switching transistor T does not take place in an excessively "hard" manner, a resistor which is not shown in FIG. 4 can be connected between the output of the driver circuit W and the gate connection of the transistor T and, together with the corresponding transistor capacitance, this ensures somewhat "softer" switching flanks. Furthermore, a protection resistor can be connected between the source connection of the switching transistor T and the supply connection (which is connected to it) of the driver circuit V, in order to protect the driver circuit V.

Figure 5:
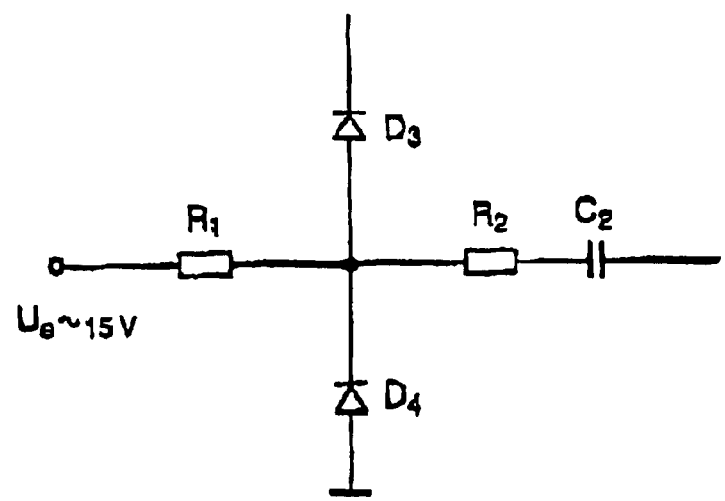
FIG. 5 shows a variant of potential clamping according to the invention, for the circuit shown in FIG. 4.
Figure 6:
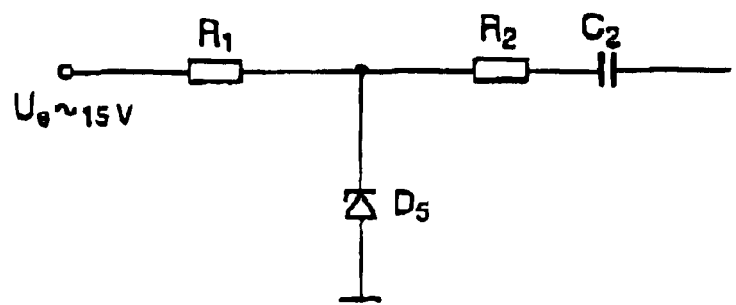
FIG. 6 shows a second variant of potential clamping according to the invention, for the circuit shown in FIG. 4.

Two further variants of the circuit path between the alternating supply potential $U_p$ and the potential isolation capacitor $C_2$ are shown in FIGS. 5 and 6. These are circuit parts for potential clamping by means of clamping diodes. The variant shown in FIG. 5 for this purpose uses two series-connected rectifier diodes $D_3$ and $D_4$, which are connected in the same sense and whose center tap is connected via a respective resistor $R_1$ or $R_2$ to the alternating supply potential $U_p$ or to the potential isolation capacitor $C_2$. Taking into account the forward voltage of the diodes $D_3$ and $D_4$, the center tap is thus clamped at a potential between, for example, −0.7 and +15.7 V. The resistor $R_1$ is used to ensure that the current surges that have been mentioned do not flow away via $C_2$ to the output stage which produces the alternating supply potential $U_p$, but flow away via the diodes $D_3$ and $D_4$. The resistor $R_2$ itself forms a current brake for the two clamping diodes $D_3$ and $D_4$. Since the potential clamping means that the resistance of the resistor $R_1$ may be considerably less than that of the resistor W shown in FIG. 4, the current which is supplied by the alternating supply potential $U_p$ is not limited excessively.

This circuit may advantageously intrinsically be a component of the already mentioned MOSFET gate.

The second variant is shown in FIG. 6. In this case a zener diode $D_5$ is used for potential clamping, instead of the two rectifier diodes $D_2$ and $D_4$.

The variant with the two clamping diodes $D_3$ and $D_4$ as shown in FIG. 5 is preferable to the variant shown in FIG. 6 because this provides the basic capability to connect the upper connection of the diode $D_3$ in FIG. 5 such that energy is fed back into the DC supply voltage $V_e$. In contrast to this, the current surge through the zener diode $D_5$ is in principle converted into a power loss.

What is claimed is:

1. A circuit for operation of a load
   having a switching transistor which is connected on one side to a supply potential and whose other side is the load side, and whose control connection can at least at times be driven outside the potential range between the supply potential and the potential on the load-side connection of the switching transistor,
   which circuit also has a driver circuit for driving the control connection, and an energy-storage capacitor for supplying the driver circuit with a supply power;
   the circuit comprising a pump circuit for charging the energy-storage capacitor from an alternating supply potential which is independent of the potential at the load-aide connection, with a series circuit, which connects the connections of the energy-storage capacitor, of two rectifier diodes connected in the same direction and with a potential isolation capacitor which is connected to a tap between the rectifier diodes on one side and the alternating supply potential on the other side.

2. The circuit as claimed in claim 1, in which the switching transistor has an FET input.

3. The circuit as claimed in claim 1, in which a first non-reactive resistor is provided between the potential isolation capacitor and the alternating supply voltage.

4. The circuit as claimed in claim 1, in which, for the purpose of impedance decoupling, a second non-reactive resistor connects the alternating supply voltage to the potential isolation capacitor via a center tap between two series-connected rectifier diodes.

5. The circuit as claimed in claim 1, in which a second non-reactive resistor connects the alternating supply voltage to the potential isolation capacitor, with a zener diode for potential clamping being connected to the connection between the second non-reactive resistor and the potential isolation capacitor.

6. The circuit as claimed in claim 1, which is designed for a lamp as the load.

7. The circuit as claimed in claim 6, which is designed for a high-pressure discharge lamp as the load.

8. The circuit as claimed in claim 7, in which the switching transistor is part of a full bridge circuit which contains the high-pressure discharge lamp.

9. The circuit as claimed in claim 1, in which the switching transistor is part of a step-down conoller circuit.

10. The circuit as claimed in claim 1, in which a voltage-limiting element is connected in parallel with the series circuit formed by the rectifier diodes and in parallel with the connections of the energy-storage capacitor.

11. The circuit as claimed in claim 2, in which a first non-reactive resistor is provided between the potential isolation capacitor and the alternating supply voltage.

12. The circuit as claimed in claim 2, in which, for the purpose of impedance decoupling, a second non-reactive resistor connects the alternating supply voltage to the potential isolation capacitor via a center tap between two series-connected rectifier diodes.

13. The circuit as claimed in claim 2, in which a second non-reactive resistor connects the alternating supply voltage to the potential isolation capacitor, with a zener diode for potential clamping being connected to the connection between the second non-reactive resistor and the potential isolation capacitor.

* * * * *